United States Patent
Ullmann et al.

(10) Patent No.: US 7,812,343 B2
(45) Date of Patent: Oct. 12, 2010

(54) MULTILAYER COMPOSITE BODY HAVING AN ELECTRONIC FUNCTION

(75) Inventors: Andreas Ullmann, Zirndorf (DE); Alexander Knobloch, Erlangen (DE); Merlin Welker, Baiersdorf (DE); Walter Fix, Nuremberg (DE)

(73) Assignee: PolyIC GmbH & Co. KG, Furth (DE)

( * ) Notice: Subject to any disclaimer, the term of this patent is extended or adjusted under 35 U.S.C. 154(b) by 365 days.

(21) Appl. No.: 11/911,429

(22) PCT Filed: Mar. 31, 2006

(86) PCT No.: PCT/EP2006/002916
§ 371 (c)(1), (2), (4) Date: Nov. 7, 2007

(87) PCT Pub. No.: WO2006/108514
PCT Pub. Date: Oct. 19, 2006

(65) Prior Publication Data
US 2008/0203383 A1     Aug. 28, 2008

(30) Foreign Application Priority Data
Apr. 15, 2005  (DE) .................. 10 2005 017 655

(51) Int. Cl.
*H01L 35/24* (2006.01)

(52) U.S. Cl. ............... 257/40; 257/79; 257/80; 257/81; 257/84; 257/88

(58) Field of Classification Search ............. None
See application file for complete search history.

(56) References Cited

U.S. PATENT DOCUMENTS

| | | | |
|---|---|---|---|
| 3,512,052 A | 5/1970 | MacIver et al. | |
| 3,769,096 A | 10/1973 | Ashkin | |
| 3,955,098 A | 5/1976 | Kawamoto | |
| 3,999,122 A | 12/1976 | Winstel et al. | |

(Continued)

FOREIGN PATENT DOCUMENTS

AU     488652     4/1976

(Continued)

OTHER PUBLICATIONS

U.S. Appl. No. 10/344,926, filed Feb. 12, 2004, Adolf Bernds et al.
U.S. Appl. No. 10/344,951, filed Feb. 12, 2004, Adolf Bernds et al.
U.S. Appl. No. 10/380,113, filed Sep. 25, 2003, Adolf Bernds et al.

(Continued)

*Primary Examiner*—N Drew Richards
*Assistant Examiner*—Kyoung Lee
(74) *Attorney, Agent, or Firm*—Carella, Byrne et al.; Elliot M. Olstein; William Squire (57) ABSTRACT

A multilayer composite body has an electronic function, in particular, an electronic subassembly comprising a plurality of organic electronic components, such as transistors, diodes, capacitors and so on, having at least one common layer, e.g., a semiconductor layer and/or insulation layer, wherein the common layer may be superfluous in one or more of the components. There thus is provided a structure of an entire subassembly such as an RFID tag, wherein the entire tag with all of its components is implemented in one production process.

18 Claims, 4 Drawing Sheets

U.S. PATENT DOCUMENTS

| | | |
|---|---|---|
| 4,246,298 A | 1/1981 | Guarnery |
| 4,302,648 A | 11/1981 | Sado et al. |
| 4,340,057 A | 7/1982 | Bloch |
| 4,442,019 A | 4/1984 | Marks |
| 4,472,627 A | 9/1984 | Weinberger |
| 4,554,229 A | 11/1985 | Small |
| 4,865,197 A | 9/1989 | Craig |
| 4,926,052 A | 5/1990 | Hatayama |
| 4,937,119 A | 6/1990 | Nikles et al. |
| 5,053,679 A | 10/1991 | Thioulouse |
| 5,075,816 A | 12/1991 | Stormbom |
| 5,173,835 A | 12/1992 | Cornett et al. |
| 5,202,677 A | 4/1993 | Parker et al. |
| 5,206,525 A | 4/1993 | Yamamoto et al. |
| 5,259,926 A | 11/1993 | Kuwabara et al. |
| 5,321,240 A | 6/1994 | Takahira |
| 5,347,144 A | 9/1994 | Garnier et al. |
| 5,364,735 A | 11/1994 | Akamatsu |
| 5,395,504 A | 3/1995 | Hoffman et al. |
| 5,480,839 A | 1/1996 | Ezawa et al. |
| 5,486,851 A | 1/1996 | Gehner et al. |
| 5,502,396 A | 3/1996 | Desarzens |
| 5,528,222 A | 6/1996 | Moskowitz |
| 5,546,889 A | 8/1996 | Wakita et al. |
| 5,569,879 A | 10/1996 | Gloton |
| 5,574,291 A | 11/1996 | Dodabalapur et al. |
| 5,578,513 A | 11/1996 | Maegawa |
| 5,580,794 A | 12/1996 | Allen |
| 5,625,199 A | 4/1997 | Baumbach et al. |
| 5,625,474 A | 4/1997 | Aomori et al. |
| 5,629,530 A | 5/1997 | Brown et al. |
| 5,630,986 A | 5/1997 | Charlton |
| 5,652,645 A | 7/1997 | Jain |
| 5,691,089 A | 11/1997 | Smayling |
| 5,693,956 A | 12/1997 | Shi |
| 5,705,826 A | 1/1998 | Aratani et al. |
| 5,707,894 A | 1/1998 | Hsiao |
| 5,729,428 A | 3/1998 | Sakata et al. |
| 5,854,139 A | 12/1998 | Kondo et al. |
| 5,869,972 A | 2/1999 | Birch et al. |
| 5,883,397 A | 3/1999 | Isoda et al. |
| 5,892,244 A | 4/1999 | Tanaka et al. |
| 5,946,551 A | 8/1999 | Dimitrakopoulos |
| 5,967,048 A | 10/1999 | Fromson et al. |
| 5,970,318 A | 10/1999 | Choi et al. |
| 5,973,598 A | 10/1999 | Beigel |
| 5,994,773 A | 11/1999 | Hirakawa |
| 5,997,817 A | 12/1999 | Crismore et al. |
| 5,998,805 A | 12/1999 | Shi et al. |
| 6,036,919 A | 3/2000 | Thym et al. |
| 6,045,977 A | 4/2000 | Chandross et al. |
| 6,060,338 A | 5/2000 | Tanaka et al. |
| 6,072,716 A | 6/2000 | Jacobson et al. |
| 6,083,104 A | 7/2000 | Choi |
| 6,087,196 A | 7/2000 | Sturm et al. |
| 6,107,920 A | 8/2000 | Eberhardt et al. |
| 6,133,835 A | 10/2000 | DeLeeuw et al. |
| 6,150,668 A | 11/2000 | Bao |
| 6,180,956 B1 | 1/2001 | Chondroudis |
| 6,197,663 B1 | 3/2001 | Chandross |
| 6,207,472 B1 | 3/2001 | Callegari et al. |
| 6,215,130 B1 | 4/2001 | Dodabalapur |
| 6,221,553 B1 | 4/2001 | Wolk |
| 6,251,513 B1 | 6/2001 | Rector |
| 6,259,506 B1 | 7/2001 | Lawandy |
| 6,284,562 B1 | 9/2001 | Batlogg et al. |
| 6,291,126 B2 | 9/2001 | Wolk et al. |
| 6,300,141 B1 | 10/2001 | Segal et al. |
| 6,321,571 B1 | 11/2001 | Themont et al. |
| 6,322,736 B1 | 11/2001 | Bao |
| 6,326,288 B1 | 12/2001 | Bornefeld |
| 6,329,226 B1 | 12/2001 | Jones |
| 6,330,464 B1 | 12/2001 | Colvin |
| 6,335,539 B1 | 1/2002 | Dimitrakopoulos et al. |
| 6,340,822 B1 | 1/2002 | Brown et al. |
| 6,366,017 B1 | 1/2002 | Miyamoto et al. |
| 6,344,662 B1 | 2/2002 | Dimitrakopoulos et al. |
| 6,350,996 B1 * | 2/2002 | Kawai et al. .................. 257/88 |
| 6,362,509 B1 | 3/2002 | Hart |
| 6,369,793 B1 | 4/2002 | Parker |
| 6,384,804 B1 | 5/2002 | Dodabalapur et al. |
| 6,403,396 B1 | 6/2002 | Gudesen et al. |
| 6,414,728 B1 | 7/2002 | Faris et al. |
| 6,429,450 B1 | 8/2002 | Mutsaers et al. |
| 6,483,473 B1 | 11/2002 | King et al. |
| 6,498,114 B1 | 12/2002 | Amundson et al. |
| 6,518,949 B2 | 2/2003 | Drazic |
| 6,521,109 B1 | 2/2003 | Bartic et al. |
| 6,528,816 B1 | 3/2003 | Jackson et al. |
| 6,541,130 B2 | 4/2003 | Fukuda |
| 6,548,875 B2 | 4/2003 | Nishiyama |
| 6,555,840 B1 | 4/2003 | Hudson |
| 6,566,156 B1 | 5/2003 | Sturm et al. |
| 6,593,690 B1 | 7/2003 | McCormick |
| 6,596,569 B1 | 7/2003 | Bao et al. |
| 6,603,139 B1 | 8/2003 | Tessler |
| 6,621,098 B1 | 9/2003 | Jackson |
| 6,686,693 B1 | 2/2004 | Ogawa |
| 6,699,728 B2 | 3/2004 | Guenther et al. |
| 7,229,868 B2 | 4/2004 | Bernds et al. |
| 6,736,985 B1 | 5/2004 | Bao et al. |
| 6,517,955 B1 | 2/2005 | Jacobsen et al. |
| 6,852,583 B2 | 2/2005 | Bernds et al. |
| 6,859,093 B1 | 2/2005 | Beigel |
| 6,903,958 B2 | 6/2005 | Bernds et al. |
| 6,960,489 B2 | 11/2005 | Bernds et al. |
| 6,999,297 B1 * | 2/2006 | Klee et al. .................. 361/303 |
| 7,064,345 B2 | 6/2006 | Fix et al. |
| 7,223,995 B2 | 5/2007 | Fix et al. |
| 7,238,961 B2 | 7/2007 | Bernds et al. |
| 2001/0006846 A1 | 7/2001 | Cao et al. |
| 2001/0026187 A1 | 10/2001 | Oku |
| 2001/0046081 A1 | 11/2001 | Hayashi et al. |
| 2001/0048341 A1 | 12/2001 | Chakravarthy |
| 2002/0018911 A1 | 2/2002 | Bernius et al. |
| 2002/0022284 A1 | 2/2002 | Heeger |
| 2002/0025391 A1 | 2/2002 | Angelopoulos |
| 2002/0053320 A1 | 5/2002 | Duthaler |
| 2002/0056839 A1 | 5/2002 | Joo et al. |
| 2002/0068392 A1 | 6/2002 | Lee et al. |
| 2002/0130042 A1 | 9/2002 | Moerman et al. |
| 2002/0170897 A1 | 11/2002 | Hall |
| 2002/0195644 A1 | 12/2002 | Dodabalapur et al. |
| 2003/0059987 A1 | 3/2003 | Sirringhaus et al. |
| 2003/0070500 A1 | 4/2003 | Hung |
| 2003/0112576 A1 | 6/2003 | Brewer et al. |
| 2003/0141807 A1 | 7/2003 | Kawase |
| 2003/0178620 A1 | 9/2003 | Bernds et al. |
| 2003/0227664 A1 | 12/2003 | Agrawal et al. |
| 2004/0002176 A1 | 1/2004 | Xu |
| 2004/0013982 A1 | 1/2004 | Jacobson et al. |
| 2004/0026689 A1 | 2/2004 | Bernds et al. |
| 2004/0029310 A1 | 2/2004 | Bernds et al. |
| 2004/0063267 A1 | 4/2004 | Bernds et al. |
| 2004/0084670 A1 | 5/2004 | Tripsas et al. |
| 2004/0092196 A1 | 5/2004 | Van De Witte et al. |
| 2004/0119504 A1 | 6/2004 | Baude et al. |
| 2004/0160389 A1 | 8/2004 | Suyama et al. |
| 2004/0211329 A1 | 10/2004 | Funahata et al. |
| 2004/0233065 A1 | 11/2004 | Freeman |
| 2004/0239586 A1 | 12/2004 | Cok |
| 2004/0246413 A1 | 12/2004 | Stephenson et al. |
| 2004/0256467 A1 | 12/2004 | Clemens et al. |
| 2005/0062066 A1 | 3/2005 | Bao et al. |

| | | | | | | |
|---|---|---|---|---|---|---|
| 2005/0098775 | A1 | 5/2005 | Kondo | EP | 0 685 985 | | 12/1995 |
| 2005/0127357 | A1 | 6/2005 | Wong et al. | EP | 0 716 458 | A2 | 6/1996 |
| 2005/0168340 | A1 | 8/2005 | Mosher et al. | EP | 0 716 458 | A3 | 6/1996 |

FOREIGN PATENT DOCUMENTS

| | | | | | |
|---|---|---|---|---|---|
| DE | 2102735 | 8/1972 | EP | 0 785 578 A2 | 7/1997 |
| DE | 33 38 597 | 5/1985 | EP | 0 785 578 A3 | 7/1997 |
| DE | 37 05 109 | 8/1987 | EP | 0 786 820 | 7/1997 |
| DE | 41 03 675 | 8/1992 | EP | 0 690 457 | 12/1999 |
| DE | 692 32 740 T2 | 4/1993 | EP | 0 962 984 A2 | 12/1999 |
| DE | 42 43 832 | 6/1994 | EP | 0 962 984 A3 | 12/1999 |
| DE | 43 12 766 | 10/1994 | EP | 0 964 516 B1 | 12/1999 |
| DE | 196 29 291 | 1/1997 | EP | 0 966 182 | 12/1999 |
| DE | 196 48 937 | 5/1997 | EP | 0 979 715 | 2/2000 |
| DE | 196 10 284 | 7/1997 | EP | 0 981 165 | 2/2000 |
| DE | 195 06 907 | 9/1998 | EP | 0 989 614 A2 | 3/2000 |
| DE | 198 52 312 | 5/1999 | EP | 1 048 912 | 11/2000 |
| DE | 198 16 860 | 11/1999 | EP | 1 052 594 | 11/2000 |
| DE | 199 18 193 | 11/1999 | EP | 1 065 725 A2 | 1/2001 |
| DE | 198 51 703 | 5/2000 | EP | 1 065 725 A3 | 1/2001 |
| DE | 100 06 257 | 9/2000 | EP | 1 083 775 | 3/2001 |
| DE | 199 21 024 | 11/2000 | EP | 1 102 335 A2 | 5/2001 |
| DE | 199 33 757 | 1/2001 | EP | 1 103 916 | 5/2001 |
| DE | 695 19 782 | 1/2001 | EP | 1 104 035 A2 | 5/2001 |
| DE | 199 35 527 | 2/2001 | EP | 1 113 502 | 7/2001 |
| DE | 199 37 262 | 3/2001 | EP | 1 134 694 | 9/2001 |
| DE | 100 12 204 | 9/2001 | EP | 1 170 851 | 1/2002 |
| DE | 100 33 112 | 1/2002 | EP | 1 215 725 | 6/2002 |
| DE | 201 11 825 | 2/2002 | EP | 1 224 999 | 7/2002 |
| DE | 100 43 204 | 4/2002 | EP | 1 237 207 | 9/2002 |
| DE | 100 45 192 | 4/2002 | EP | 1 251 720 | 10/2002 |
| DE | 100 47 171 | 4/2002 | EP | 1 251 720 A2 | 10/2002 |
| DE | 100 58 559 | 5/2002 | EP | 1 296 280 | 3/2003 |
| DE | 100 61 297 | 6/2002 | EP | 1 296 280 A1 | 3/2003 |
| DE | 101 17 663 | 10/2002 | EP | 1 318 084 | 6/2003 |
| DE | 101 20 687 | 10/2002 | EP | 1 383 179 | 1/2004 |
| DE | 101 20 686 | 11/2002 | EP | 1 383 179 A2 | 1/2004 |
| DE | 101 26 859 | 12/2002 | EP | 1 401 245 | 3/2004 |
| DE | 101 26 860 | 12/2002 | EP | 1 434 281 | 6/2004 |
| DE | 101 41 440 | 3/2003 | FR | 2793089 | 11/2000 |
| DE | 101 53 656 | 5/2003 | GB | 723598 | 2/1955 |
| DE | 101 51 440 | 6/2003 | GB | 2 058 462 | 4/1981 |
| DE | 101 51 440 C1 | 6/2003 | JP | 54069392 | 6/1979 |
| DE | 101 63 267 | 7/2003 | JP | 60117769 | 6/1985 |
| DE | 102 09 400 | 10/2003 | JP | 61001060 | 1/1986 |
| DE | 102 12 640 | 10/2003 | JP | 61167854 | 7/1986 |
| DE | 102 19 905 | 12/2003 | JP | 62065472 A | 3/1987 |
| DE | 102 29 168 | 1/2004 | JP | 362065477 A | 3/1987 |
| DE | 103 41 962 | 4/2004 | JP | 63205943 | 8/1988 |
| DE | 103 30 064 | 9/2004 | JP | 01169942 | 7/1989 |
| DE | 699 13 745 | 10/2004 | JP | 2969184 | 12/1991 |
| DE | 103 30 063 | 2/2005 | JP | 03290976 A | 12/1991 |
| DE | 103 35 336 | 3/2005 | JP | 05152560 | 6/1993 |
| DE | 103 38 277 | 3/2005 | JP | 05259434 | 10/1993 |
| DE | 103 40 641 A1 | 4/2005 | JP | 05347422 | 12/1993 |
| DE | 103 40 641 | 7/2005 | JP | 06-196724 | 7/1994 |
| EP | 0 108 650 | 5/1984 | JP | 08197788 | 8/1995 |
| EP | 0 128 529 | 12/1984 | JP | 09083040 | 3/1997 |
| EP | 0 268 370 A2 | 5/1988 | JP | 09320760 | 12/1997 |
| EP | 0 268 370 A3 | 5/1988 | JP | 10026934 | 1/1998 |
| EP | 0 350 179 | 1/1990 | JP | 11-040708 | 2/1999 |
| EP | 0 418 504 | 3/1991 | JP | 2000-029403 | 1/2000 |
| EP | 0 435 029 | 7/1991 | JP | 2000-173770 | 6/2000 |
| EP | 0 442 123 | 8/1991 | JP | 2001-085272 | 3/2001 |
| EP | 0 460 242 | 12/1991 | JP | 2001-147659 | 5/2001 |
| EP | 0 501 456 A2 | 9/1992 | JP | 2001-267578 | 9/2001 |
| EP | 0 501 456 A3 | 9/1992 | WO | WO 93/16491 | 8/1993 |
| EP | 0 511 807 | 11/1992 | WO | WO 94/17556 | 8/1994 |
| EP | 0 528 662 | 2/1993 | WO | WO 95/06240 | 3/1995 |
| EP | 0 588 721 | 3/1994 | WO | WO 95/31831 | 11/1995 |
| EP | 0 603 939 A2 | 6/1994 | WO | WO 96/02924 | 2/1996 |
| EP | 0 615 256 | 9/1994 | WO | WO 96/19792 | 6/1996 |
| | | | WO | WO 97/12349 | 4/1997 |
| | | | WO | WO 97/18944 | 5/1997 |
| | | | WO | WO 98/18156 | 4/1998 |

| | | |
|---|---|---|
| WO | WO 98/18186 | 4/1998 |
| WO | WO 98/40930 | 9/1998 |
| WO | WO 99/07189 | 2/1999 |
| WO | WO 99/10769 | 3/1999 |
| WO | WO 99/10929 | 3/1999 |
| WO | WO 99/10939 | 3/1999 |
| WO | WO 99/21233 | 4/1999 |
| WO | WO 99/30432 | 6/1999 |
| WO | WO 99/39373 | 8/1999 |
| WO | WO 99/40631 | 8/1999 |
| WO | WO 99/53371 | 10/1999 |
| WO | WO 99/54842 | 10/1999 |
| WO | WO 99/54936 | 10/1999 |
| WO | WO 99/66540 | 12/1999 |
| WO | WO 00/07151 | 2/2000 |
| WO | WO 00/33063 | 6/2000 |
| WO | WO 00/36666 | 6/2000 |
| WO | WO 00/76778 | 12/2000 |
| WO | WO 00/79617 | 12/2000 |
| WO | WO 01/03126 | 1/2001 |
| WO | WO 01/06442 | 1/2001 |
| WO | WO 01/08241 | 2/2001 |
| WO | WO 01/15233 | 3/2001 |
| WO | WO 01/17029 | 3/2001 |
| WO | WO 01/17041 | 3/2001 |
| WO | WO 01/27998 | 4/2001 |
| WO | WO 01/35500 | 5/2001 |
| WO | WO 01/46987 | 6/2001 |
| WO | WO 01/47044 A2 | 6/2001 |
| WO | WO 01/47044 A3 | 6/2001 |
| WO | WO 01/47045 | 6/2001 |
| WO | WO 01/69517 | 9/2001 |
| WO | WO 01/73109 A2 | 10/2001 |
| WO | WO 01/73109 A3 | 10/2001 |
| WO | WO 02/05360 | 1/2002 |
| WO | WO 02/05361 | 1/2002 |
| WO | WO 02/15264 | 2/2002 |
| WO | WO 02/17233 | 2/2002 |
| WO | WO 02/19443 | 3/2002 |
| WO | WO 02/21612 | 3/2002 |
| WO | WO 02/29912 | 4/2002 |
| WO | WO 02/43071 | 5/2002 |
| WO | WO 02/47183 | 6/2002 |
| WO | WO 02/065557 A1 | 8/2002 |
| WO | WO 02/071139 | 9/2002 |
| WO | WO 02/071505 | 9/2002 |
| WO | WO 02/076924 | 10/2002 |
| WO | WO 02/091495 A2 | 11/2002 |
| WO | WO 02/091495 A3 | 11/2002 |
| WO | WO 02/095805 A2 | 11/2002 |
| WO | WO 02/095805 A3 | 11/2002 |
| WO | WO 02/099907 | 12/2002 |
| WO | WO 02/099908 | 12/2002 |
| WO | WO 03/027948 | 4/2003 |
| WO | WO 03/036686 | 5/2003 |
| WO | WO 03/038897 | 5/2003 |
| WO | WO 03/046922 | 6/2003 |
| WO | WO 03/057501 | 7/2003 |
| WO | WO 03/067680 | 8/2003 |
| WO | WO 03/069552 | 8/2003 |
| WO | WO 03/081671 | 10/2003 |
| WO | WO 03/095175 | 11/2003 |
| WO | WO 2004/032257 | 4/2004 |
| WO | WO 2004/042837 A2 | 5/2004 |
| WO | WO 2004/042837 A3 | 5/2004 |
| WO | WO 2004/047144 A2 | 6/2004 |
| WO | WO 2004/047144 A3 | 6/2004 |
| WO | WO 2004/047194 A2 | 6/2004 |
| WO | WO 2004/047194 A3 | 6/2004 |
| WO | WO 2004/063806 | 7/2004 |
| WO | WO 2004/068608 | 8/2004 |
| WO | WO 2004/083859 | 9/2004 |
| WO | WO 2004/068267 | 12/2004 |
| WO | WO 2004/111729 | 12/2004 |
| WO | WO 2005/004194 | 1/2005 |
| WO | WO 2005/022664 | 3/2005 |
| WO | WO 2005/027216 | 3/2005 |

OTHER PUBLICATIONS

U.S. Appl. No. 10/381,032, filed Feb. 12, 2004, Adolf Bernds et al.
U.S. Appl. No. 10/433,961, filed Apr. 1, 2004, Wolfgang Clemens et al.
U.S. Appl. No. 10/451,108, filed May 13, 2004, Mark Giles et al.
U.S. Appl. No. 10/473,050, filed May 20, 2004, Adolf Bernds et al.
U.S. Appl. No. 10/479,234, filed Dec. 30, 2004, Adolf Bernds et al.
U.S. Appl. No. 10/479,238, filed Oct. 20, 2004, Adolf Bernds et al.
U.S. Appl. No. 10/492,922, filed Mar. 3, 2005, Erwann Buillet et al.
U.S. Appl. No. 10/492,923, filed Dec. 23, 2004, Wolfgang Clemens et al.
U.S. Appl. No. 10/508,737, filed May 19, 2005, Adolf Bernds et al.
U.S. Appl. No. 10/517,750, filed Oct. 13, 2005, Wolfgang Clemens et al.
U.S. Appl. No. 10/523,216, filed Feb. 2, 2006, Adolf Bernds et al.
U.S. Appl. No. 10/523,487, filed Apr. 13, 2006, Wolfgang Clemens et al.
U.S. Appl. No. 10/524,646, filed May 11, 2006, Walter Fix et al.
U.S. Appl. No. 10/533,756, filed Jun. 8, 2006, Wolfgang Clemens et al.
U.S. Appl. No. 10/534,678, filed Jun. 8, 2006, Wolfgang Clemens et al.
U.S. Appl. No. 10/535,448, filed Jun. 8, 2006, W. Clemens et al.
U.S. Appl. No. 10/535,449, filed Feb. 16, 2006, Walter Fix et al.
U.S. Appl. No. 10/344,926, filed Feb. 12, 2004, Adolf Bernds et al.
U.S. Appl. No. 10/541,815, filed Jun. 8, 2006, Axel Gerlt et al.
U.S. Appl. No. 10/541,956, filed Jun. 15, 2006, Wolfgang Clemens et al.
U.S. Appl. No. 10/541,957, filed Jul. 6, 2006, Walter Fix et al.
U.S. Appl. No. 10/542,679, filed Mar. 16, 2006, Adolf Bernds et al.
U.S. Appl. No. 10/562,989, filed Jun. 29, 2006, Jurgen Ficker et al.
U.S. Appl. No. 10/562,869, filed Oct. 5, 2006, Wolfram Glauert.
U.S. Appl. No. 10/569,763, filed Aug. 16, 2007, Walter Fix et al.
U.S. Appl. No. 10/568,730, filed Feb. 8, 2007, Wolfgang Clemens et al.
U.S. Appl. No. 10/569,233, filed Jan. 25, 2007, Adolf Bernds et al.
U.S. Appl. No. 10/570,571, filed Jan. 11, 2007, Clemens et al.
U.S. Appl. No. 10/585,775, Walter Fix et al.
U.S. Appl. No. 11/574,139, filed Mar. 13, 2008, Jurgen Ficker et al.
U.S. Appl. No. 11/721,284, Markus Bohm et al.
U.S. Appl. No. 11/721,219, Wolfgang Clemens et al.
U.S. Appl. No. 11/721,244, Robert Blache et al.
U.S. Appl. No. 11/722,457, Markus Bohm et al.
U.S. Appl. No. 11/817,258, Andreas Ullmann et al.
U.S. Appl. No. 11/817,329, Andreas Ullmann et al.
U.S. Appl. No. 11/911,429, Andreas Ullmann et al.
U.S. Appl. No. 11/994,571, Klaus Ludwig et al.
U.S. Appl. No. 11/997,235, Alexander Knobloch et al.
U.S. Appl. No. 11/989,623, Andreas Ullmann et al,.
U.S. Appl. No. 12/065,757, Andreas Ullmann et al.
Angelopoulos M et al., "In-Situ Radiation Induced Doping", Mol. Crystl. Liq. Cryst., 1990, vol. 189, pp. 221-225.
Assadi A, et al:, Field-Effect Mobility of Poly (3-Hexylthiophene) Dept. of Physics and Measurement Technology, Received Mar. 3, 1988; accepted for Publication May 17, 1988.
Backlund, et al, "Towards all-polymer field-effect transistors with solution processable materials", Synthetic Metals, Elsevier Sequoia, Lausanne, CH, vol. 148, No. 1, Jan. 3, 2005, pp. 87-91.
Bao, Z. et al., "High-Performance Plastic Transistors Fabricatecd by Printing Techniques", Chem. Mater vol. 9, No. 6, 1997, pp. 1299-1301.
Bao, Z. et al. "Organic and Polymeric Materials for the Fabrications of Thin Film Field-Effect Transistors", paper presented at the meeting of American Chemical Society, Division of Polymer Chemistry, XX, XX, vol. 39, No. 1, Mar. 29, 1998.

Baude P F et al, "Organic semiconductor RFID transponders" International Electron Devices Meeting 2003. IEDM. Technical Digest. Washington, DC, Dec. 8-10, 2003, New York NY, IEEE, US Dec. 8, 2003, pp. 191-194.

Becker, Eike, et al., "A New Structuring Technique for Polymer Integrated Circuits", Institut fur Hochfrequenztechnik, TU Braunschweit, Germany, Session 4: Polymer Electronic Devices II, pp. 95-97.

Belloni, F. et al, "Parameters Optimization for Improved Dynamics of Voltage Multipliers for Space", 2004 35$^{th}$ Annual IEEE Electronics Specialists Conference, Aachen, Germany, 2004, pp. 439-442.

Bonse M. et al., "Integrated a-Si:H/Pentacene Inorganic Organic Complementary Circuits" in IEEE, IEDM 98, pp. 249-252.

Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.

Brabec, C.J. et al., "Photovoltaic properties of a conjugated polymer/ methanofullerene composites embedded in a polystyrene matrix", Journal of Applied Physics, vol. 85, No. 9, 1999, pp. 6866-6872.

Braun D., et al, "Visible light emission from semiconducting polymer diodes", American Institute of Physics, Applied Physics Letters 58, May 6, 1991, pp. 1982-1984.

Brown, A.R. et al., "Field-effect transistors made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.

Chen, X.L. et al., "Morphological and Transistor Studies of Organic Molecular Semiconductors with Anisotropic Electrical Characteristics", American Chemical Society, 2001, Chem. Mater. 2001, 13, 1341-1348.

Clemens, W. et al., "Vom Organischen Transistor Zum Plastik-Chip," Physik Journal, V. 2, 2003, pp. 31-36.

Collet J. et al:, Low Voltage, 30 NM Channel Length, Organic Transistors With a Self-Assembled Monolayer as Gate Insulating Films:, Applied Physics Letters, American Institute of Physics. New York, US, Bd 76, Nr. 14, Apr. 3 2000, Seiten 1941-1943, XP000950589, ISSN:0003-6951, das ganze Dokument.

Cox, Robert W. et al., "A Minimally Intrusive, Low Cost System for Determining Indoor Air Flow Patterns", Computers In Power Electronics, 2004. IEEE Workshop on Urbana, IL Aug. 15-18, 2004, Piscataway, NJ, IEEE, Aug. 15, 2004, pp. 63-68.

Crone, B. et al, "Large-scale complementary Integrated circuits based on Organic transistors", Nature, vol. 403, Feb. 3, 2000, pp. 521 -.

Crone B. K. et al., "Design and Fabrication of Organic Complementary Circuits", J. Appl. Phys. vol. 89, May 2001, pp. 5125-5132.

Dai, L. et al, Photochemical Generation of Conducting Pattersn in Polybutadiene Films:, Macromolecules, vol. 29, No. 1, 1996, pp. 282-287, XP 001042019, the whole document.

Dai, L. et al., "Conjugation of Polydienes by Oxidants Other Than Iodine", Elsevier Science S.A., Synthetic Metals 86 (1997) 1893-1894.

Dai, L. et al., I$_2$-Doping" of 1,4-Polydienes*, Elsevier Science S.A., Synthetic Metals 69 (1995), pp. 563-566.

De Leeuw C.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.

Dodabalapur, A. et al., Organic smart pixels, American Institute of Physics, Applied Physics Letters, vol. 73, No. 2, Jul. 13, 1998, pp. 142-144.

Drury et al., "Low-Cost All-Polymer Integrated Circuits", American Institute of Physics, Applied Physics Letters, 1998, vol. 73, No. 1, pp. 108-110, Jul. 6, 1998.

Ficker, J. et el., "Dynamic and Lifetime Measurements of Polymer OFETS and Integrated Plastic Circuits," Proc. of SPIE, v. 466, 2001, pp. 95-102.

Fix, W. et al., "Fast Polymer Integrated Circuits Based on a Polyfluorene Derivative", ESSDERC 2002, 2002, pp. 527-529.

Fix, W., et al., "Fast polymer integrated circuits", American Institute of Physics, Applied Physics Letters, vol. 81, No. 89, Aug. 2002, pp. 1735-1737.

Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zelle 58-Seite 34, linke Spalte, Zeile 24; Abbildung 5.

Fraunhofer Magazin- Polytronic Chips Von der Rolle, 4.2001, pp. 8-13.

Garbassi F., et al., "Bulk Modifications", Polymer Surfaces, John Wiley & Sons, 1998, pp. 289-300.

Garnier F et al:, "Vertical Devices Architecture By Molding of Organic-Based Thin Film Transistor", Applied Physics Letters, American Institute of Physics. XP000784120, issn: 0003-6951 abbildung 2.

Garnier, F. et al, "All-Polymer Field-Effect Transistor Realized by Printing Techniques", Science, American Association for the Advancement of Science, US, vol. 265, Sep. 16, 1994, pp. 1684-1686.

Garnier et al., "Conjugated Polymers and Oligomers as Active Material For Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Goncalves_Conto, Sylvie, et al., "Interface Morphology in Organic Light-Emitting Diodes", Advanced Materials 1999, vol. 11, No. 2, pp. 112-115.

Gosain, D.P., "Excimer laser crystallized poly-Si TFT's on plastic substrates", Second International Symposium on Laser Precision Microfabrication, May 16-18, 2001, Singapore, vol. 4426, pp. 394-400.

Halls, J.J. M., et al., "Efficient photodiodes from interpenetrating polymer networks", Nature, vol. 376, Aug. 10, 1995, pp. 498-500.

Harsanyi G. et al, "Polytronics for biogtronics:unique possibilities of polymers in biosensors and BioMEMS", IEEE Polytronic 2002 Conference, Jun. 23, 2002, pp. 211-215.

Hart, C.M. et al, "Low-cost all-polymer integrated circuits", Solid-State Circuits Conference, 1998. EXXCIRC'98 Proceedings of the 24$^{th}$ European, The Hague, The Netherlands Sep. 22-24, 1998, Piscataway, NJ, USA, IEEE, Sep. 22, 1998, pp. 30-34.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Hergel, H. J.: "Pld-Programmiertechnologien", Elektronik, Franzis Verlag GMBH. Munchen, DE, Bd 41, Nr. 5, Mar. 3, 1992, Seiten 44-46, XP000293121, ISSN: 0013-5658, Abbildungen 1-3.

Hofstraat, Hans, "Will Polymer Electronics Change the Electronics Industry?", Philips Research, Keynote Session, Department Polymers & Organic Chemistry and University of Amsterdam, The Netherlands, 2001.

Hwang J D et al:, "A Vertical Submicron Slc thin film transistor", Solid State Electronics, Elsevier Science Publishers, Barking, GB, Bd. 38, Nr. 2, Feb. 1, 1995, Seiten 275-278, XP004014040, ISSN:0038-1101, Abbildung 2.

IBM Technical Disclosure Bulletin, "Short-Channel Field-Effect Transistor", IBM Corp., New York, US, Bd. 32, Nr. 3A, Aug. 1, 1989, Seiten 77-78, XP000049357, ISSN:0018-8689, das ganze Dokument.

Ishiwara, Hiroshi, "Current Status and Prosepcts of Ferroelectric Memories", Frontier Collaborative Research Center, Tokyo Institute of Technology, Yokohama, Japan, IEDM 725-728.

Kamba, S. et al., "Dielectric dispersion of the relaxor PLZT ceramics in the frequency rangee 20Hz—100 THz", J. Phys.: Condens. Matter 12 (2000), pp. 497-519.

Kawase, T., et al., "Inkjet Printed Via-Hole Interconnections and Resistors for All-Polymer Transistor Circuits", Advanced Materials 2001, 13, No. 21, Nov. 2, 2001, pp. 1601-1605.

Kawase, T. et al., "Inkjet printing of polymer thin film transistors", Thin Solid Films 438-439 (2003) 279-287.

Kind, D., "Einfuhrung in die Hochspannungs-Versuchstechnik", Friedrich. Vieweg & Sohn, Braunschweig/Wiesbaden, pp. 16-21.

Klauk, H. et al., "Fast Organic Thin Film Transistor Circuits", IEEE Electron Device Letters, vol. 20, No. 6, pp. 289-291.

Klauk, H. et al., "Pentacene Thin Film Transistors and Inverter Circuits", 1997 International Exectron Devices Meeting Technical Digest, pp. 539-542, Dec. 1997.

Kleim, Herbert et al., "Dielectric Permittivity of $Si_3N$ and $SiO_4$ Increased by Electrode Profile and Material", 1999 Conference on Electrical Insulation and Dielectric Phenomena.

Knobloch, A. et al., "Printed Polymer Transistors", Proc. Polytronic, v. 84, 2001, pp. 84-89.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Koezuka, H. et al., "Macromolecular Electronic Device", Mol. Cryst. Liq. Cryst. 1994, vol. 2555, pp. 221-230.

Kuhlmann et al., "Terabytes in Plastikfolie", Organische Massenspeicher vor der Serienproduktion.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Kymissis, Ioannis, et al., "High-Performance Bottom Electrode Organic Thin-Film Transistors", IEEE Transactions on Electron Devices, vol, 48, No. 6, Jun. 2001, pp. 1060-1064.

Lidzey, D. G. et al., "Photoprocessed and Micropatterned Conjugated Polymer LEDs", Synthetic Metals, V. 82, 1996, pp. 141-148.

Lowe, J. et al., "Poly (3-(2-Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.

Lu, Wen et al.: "Use of Ionic Liquids for π-Conjugated Polymer Electrochemical Devices", Science, vol. 297, 2002, pp. 983-987/.

Lucent Technologies, "Innovation marks significant milestone in the development of electronic paper", Cambridge, MA and Murray Hill, NJ, Nov. 20, 2000. XP-002209726.

Manuelli, Alessandro et al., "Applicability of Coating Techniques for the Production of Organic Field Effect Transistors", IEEE Polytronic 2002 Conference, 2002, pp. 201-204.

Marko, H., Vorlesungsmanuskript "Nachrichtentechnik 2 (Modulationsverfahren" des Lehrstuhls fur Nachrichtentechnik der Technischen Universitat Munchen, 1989.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Nalwa, H.S., "Organic Conductive Molecules and Polymers", vol, 2, 1997, pp. 534-535.

Oelkrug, D. et al., "Electronic spectra of self-organized oligothiophene films with 'standing' and 'lying' molecular units", Elsevier Science S.A., 1996, Thin Solid Films 284-270.

"New Plastic Circuits are Flexible Enough to be Folded in Half", Internet Citation, (On line) Dec. 8, 1997, pp. 1-3, www.research.philips.com/pressmedia/releases/97005E.html.

Prosandeev. S.A., et al., "Characteristics and the nature of the low-frequency dielectric response in moderately concentrated $KTaO_3$:Ii", Institute of Physics Publishing, Journal of Physics; Condensed Matter 13 (2001) pp. 9749-9760.

Qiao, X. et al., "The FeCI3-doped poly3-alkithiophenes) in solid state", Elsevier Science, Synthetic Metals 122 (2001) pp. 449-454.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Redinger, David et al., "An all-printed passive component technology for low-cost RFID", Device Research Conterence, Jun. 23, 2003 , pp. 187-188.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, 5. Juli 1999 (Jul. 7, 2005), Seiten 741-745, P000851834, ISSN: 0935-9648, das ganze Dokument.

Rogers, J.A. et al., "Organic Smart Pixels and Complementary Inverter Circuits Formed on Plastic Substrates by Casting and Rubber Stamping", IEEE Electron Devices Letters, vol. 21, No. 3, Mar. 2000, pp. 100-103.

Roman et al., "Polymer Diodes With High Rectification", Applied Physics Letters, vol. 75, No. 21, Nov. 22, 1999.

Rost, Henning et al., "All-Polymer Organic Field Effect Transistors", Proc. Mat. Week, CD, 2001, pp. 1-6.

Sandberg, H. et al, "Ultra-thin Organic Films for Field Effect Transistors", SPIE vol. 4466, 2001, pp. 35-43.

Schoebel, "Frequency Conversion with Organic-On-Inorganic Heterostructured Diodes", Extended Abstracts of the International Conference on Solid State Devices and Materials, Sep. 1, 1997.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seitenn 91-94.

Sirringhaus H., et al, "High Resolution Inkjet Printing of All-Polymer Transistor Circuits", Science, vol. 290, Dec. 15, 2000, pp. 2123-2126.

Speakman, S.P. et al., High performance organic semiconducting thin films: Ink Jet printed polythophene [rr-P3HT], Organic Electronics 2 (2), 2001, pp. 65-73.

Subramanian, V.. et al., "Printed Organic Transistors for Ultra-low-cost RFID Applications", Polymers and Adhesives in Microelectronics and Photonics, 2004, Polytronic 2004. $4^{th}$ IEEE International Conference , Portland, OR, USA, Sep. 12-15, 2004, Piscataway, NJ, pp. 67-71.

Ullman, A. et al., "High Performance Organic Field-Effect Transistors and Integrated Inverters", Mat. Res. Soc. Symp. Proc., v. 665, 2001, pp. 265-270.

Wang, Yading et al., "Electrically Conductive Semiinterpenetrating Polymer Networks of Poly(3-octyithiophene)", Macromolecules 1992, vol. 25, pp. 3284-3290.

Weiss, Ray, "Flash Memory Takes Over", Electronic Design Online ID#3756, Aug. 20, 2001.

Yasufuki, Sachio et al., "Dielectric and Thermoanalytical Behaviour of Moisture and Water in Aromatic Polyamide and Polymide Films", Conference Record of the 1994 IEEE International Symposium on Electrical Insulation, Pittsburgh, PA, USA, Jun. 5-8, 1994.

Yu, G. et al., "Dual-function semiconducting polymer devices: Light-emitting and photodetecting diodes", American Institute of Physics, Applied Physics Letter 64, Mar. 21, 1994, pp. 1540-1542.

Zangara L., "Metall Statt Halbleiter, Programmierung, Von Embedded ROMS Ueber Die Metallisierungen", Elektronik, Franzis Verlag GmbH, Munchen, DE, vol. 47, No. 16, Aug. 4, 1998, pp. 52-55.

Zheng, Xiang-Yang et al., "Electrochemical Patterning of the Surface of Insulators with Electrically Conductive Polymers", J. Electrochem. Soc., v. 142, 1995, pp. L226-L227.

Shaheen, S.E., et al., "Low band-gap polymeric photovoltaic devices", Synthetic Metals, vol. 121, 2001, pp. 1583-1584.

Takashima, W. et al., "Electroplasticity Memory Devices Using Conducting Polymers and Solid Polymer Electrolytes", Polymer International, Melbourne, 1992, pp. 249-253.

Velu, G. et al., "Low Driving Voltages and Memory Effect in Organic Thin-Film Transistors With A Ferroelectric Gate Insulator", Applied Physics Letters, American Institute of Physics, New York, vol. 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Zie Voor Titel Boek, d 2e Pagina, XP-002189001, p. 196-228.

"New Plastic Circuits are Flexible Enough to be Folded in Half", Internet Citation, (on line), Dec. 8, 1997, pp. 1-3, URL:http://www.research.philips.com/pressmedia/releases/97005E.html.

* cited by examiner

MULTILAYER COMPOSITE BODY HAVING AN ELECTRONIC FUNCTION

The invention relates to a multilayer composite body having an electronic function, in particular an electronic subassembly comprising a plurality of organic electronic components.

Electronic components are disclosed, for example, in WO 02/15264. An electronic component is generally produced by successively applying the various functional layers (conductive layer, semiconductive layer, insulating layer and conductive layer again) to a substrate. A plurality of electronic components can be combined on a printed circuit board, as described, for example, in DE 101 51 440 C1.

The disadvantage of the currently used subassemblies is that a multiplicity of individual components must be individually and successively produced, connected in an electrically conductive manner and arranged in order to form a more complex subassembly. Various costly work steps and process steps are required for this purpose.

It is an object of the present invention to provide a structure for a subassembly, which structure can be implemented simply and cost-effectively in a manner suitable for mass production and in which a multiplicity of essential electronic components, that is to say active and passive components alike, such as a transistor, field effect transistor, electrical contact via, resistor, interconnect resistor, coil, capacitor, rectifier or the like, can be combined in any desired manner and, in particular, with a diode.

The invention relates to a multilayer composite body comprising at least two different electronic components which have at least two layers, which are each applied in one operation and may be homogeneous or patterned, in common.

One of the layers which is common to the components of the composite body according to the invention is, for example, a homogeneous or patterned semiconductive layer and/or other layer, for example also a layer which, on account of its high viscosity, is not patterned during application under certain circumstances.

According to one advantageous refinement of the invention, all of the components of the composite body, that is to say different components and any desired number of the latter, are simultaneously produced on the same substrate, for example in a continuous process. This results in some components comprising layers which have no functionality in the component.

One of the at least two layers, but, in principle, even five or more layers, which is common to the components of the composite body is likewise preferably the carrier layer, that is to say the substrate which is common to all components.

According to one preferred embodiment, all of the components of a multilayer composite body are constructed from cohesive layers, some of the layers being patterned and others being continuously homogeneous layers. These layers are simultaneously produced for all of the components in the composite body and, if necessary, are suitably patterned for the respective component.

Subassemblies which contain at least one diode and an additional different component are preferably implemented with the multilayer composite body.

For example, a simple rectifier is implemented as the multilayer composite body, at least two different components, a diode and a capacitance, being present in the composite body.

A complex rectifier may also be implemented in the multilayer composite body if at least three different components, at least two diodes, a capacitance and a contact via, are contained in the subassembly which forms the composite body.

In order to construct a simple rectifier with a modulator, the multilayer composite body has, for example, at least three different components, a diode, a capacitance and a transistor.

Finally, there are at least four different components, a diode, a capacitance, a transistor and one or more contact vias, for the purpose of constructing a transponder in the multilayer composite body.

The multilayer composite body may, in principle, contain all possible components, such as a transistor, field effect transistor, electrical contact via, resistor, interconnect resistor, coil, capacitor, rectifier or the like, in any desired number and, in particular, such that they can be combined with one or more diodes.

The multilayer composite body preferably has two materials, which are different in terms of their work function, in the two conductive layers. In this case, it is particularly preferred for the conductive layer which is in contact with the semiconductive layer to be composed of silver and for the material of the counterelectrode to then be a material with a different work function, in particular a more base material, for example copper, nickel, chromium, cobalt or the like.

When producing the subassembly, it is particularly preferred for all of the components to be produced in one production process using four patterned layers and their well thought-out superimposition.

In this case, the typical structure, from bottom to top, is the sequence of substrate, conductive layer, semiconductive layer, insulating layer and upper conductive layer. A "bottom-up" layer sequence is also conceivable and is concomitantly included in the concept of the invention.

In this case, it is particularly preferred for the two conductive layers of the composite body to be made of different materials which have, in particular, a different work function or a different Fermi level. This is achieved, for example, by using metallic layers composed of two dissimilar metals and/or alloys. In this case, the use of silver as the electrode which adjoins the semiconductive layer, in particular as the conductive layer in contact with the semiconductor layer, and another metal/alloy with a work function different to that of silver as the counterelectrode is particularly preferred.

The invention will also be explained in more detail below using 4 drawings which schematically represent preferred embodiments of the invention.

Figure 1:
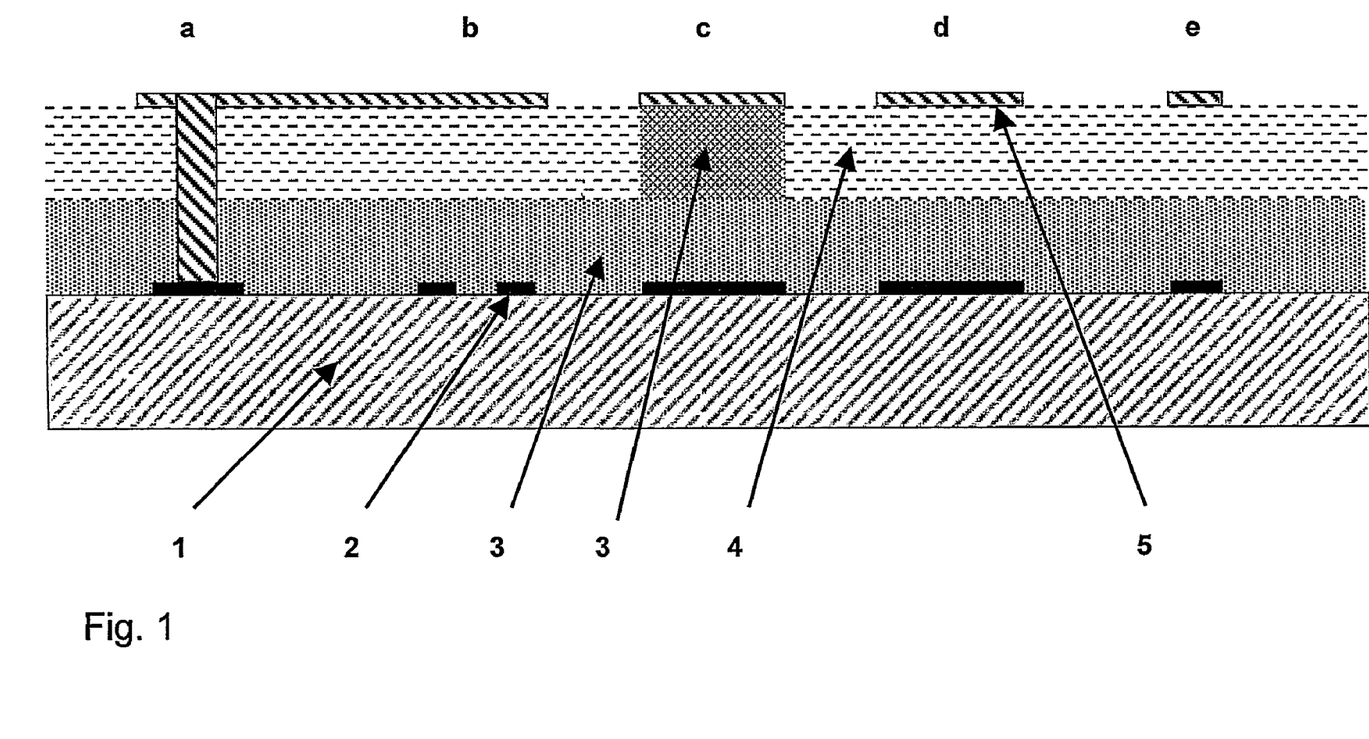
FIG. 1 shows a schematic cross section through fully integrated printable electronics as are required, for example, for a complete transponder circuit.

The substrate 1 can be seen at the bottom of FIG. 1. All insulating materials having a smooth surface can be used as the substrate; flexible and rigid materials alike can be used. Flexible films such as PET film or other polymer plastic films, glass, quartz, ceramic or another material are used, for example, at that location.

The layer 2 which follows the substrate 1 is the first conductive layer or the lower electrode 2 which is applied in patterned form. According to one advantageous refinement, the source and drain electrodes which are covered by the subsequent semiconductor layer are produced here. Only conductive materials can be used for the conductive layer 2, in which case it is not important whether they are organic or inorganic materials or a composite material. According to one preferred embodiment, a metal or an alloy having a work function in the range of 4.6-5.2 eV, preferably 4.9 eV, is used as the material for the conductive layer which is in contact with the semiconductive layer. Silver having a work function of 4.9 eV is particularly preferably used at that location. When selecting the material, it is preferably ensured that the work function is matched to the Fermi level of the semiconductor in such a manner that the difference to the Fermi level of the semiconductor is preferably 0.3 eV or less. It is then ensured that the charge carriers pass from the semiconductive material into the conductive material without any problems.

The semiconductive layer 3 which, on account of its viscosity, is applied in unpatterned form under certain circumstances follows the first and lower electrode layer. Organic materials such as P3AT, P3DHTT, regioregular polyalkylthiophenes, polyfluorene derivatives, PPVs, in general, and/or other polymers, for example with a conjugated main chain or a freely mobile electron pair in the main chain, are preferably used as materials for the semiconductive layer. The semiconductive layer 3 may also be applied in patterned form, for example by means of printing.

This is followed, in most electronic components, by an insulating layer 4 which has to be applied in patterned form only insofar as a dielectric layer or insulating layer should be omitted at that/those location(s) on the substrate at which diodes or contact vias are produced because it would interfere. The insulating layer 4 is composed, for example, of a soluble printable material. Organic soluble materials, for example polystyrene derivatives, PMMA or generally insulating polymers, are preferably used as materials for the insulating layer.

As the termination of the essential parts of the electronic components, the patterned insulating layer 4 is followed by an upper conductive layer 5 which in turn is preferably patterned. Conductive organic and inorganic materials and/or composite materials are used in this case. Metals whose work function is different to that of the material of the lower conductive layer (counterelectrode) are preferably used, in particular. According to one embodiment, materials whose work function is in the range of from 3 to 5 eV, in particular from 3.0 eV to 4.6 eV, or above, are used in this case; copper, nickel, chromium, cobalt, manganese etc. are successfully used in this case, for example.

The following components are then implemented on the substrate 1 of FIG. 1, from left to right: an electrical contact via a; following the latter and connected thereto, for example, by means of the upper conductive layer 5 is a transistor b whose source/drain electrodes are in the lower conductive layer 2. A diode c in which the semiconductive layer 3 is pulled up as far as the level of the counterelectrode 5 so that no current/voltage losses are produced is arranged beside the transistor b. A capacitor d can be seen to the right of the diode c and a resistor or a coil e is in turn situated to the right of said capacitor, that is to say on the far right on the outside.

Figure 2:
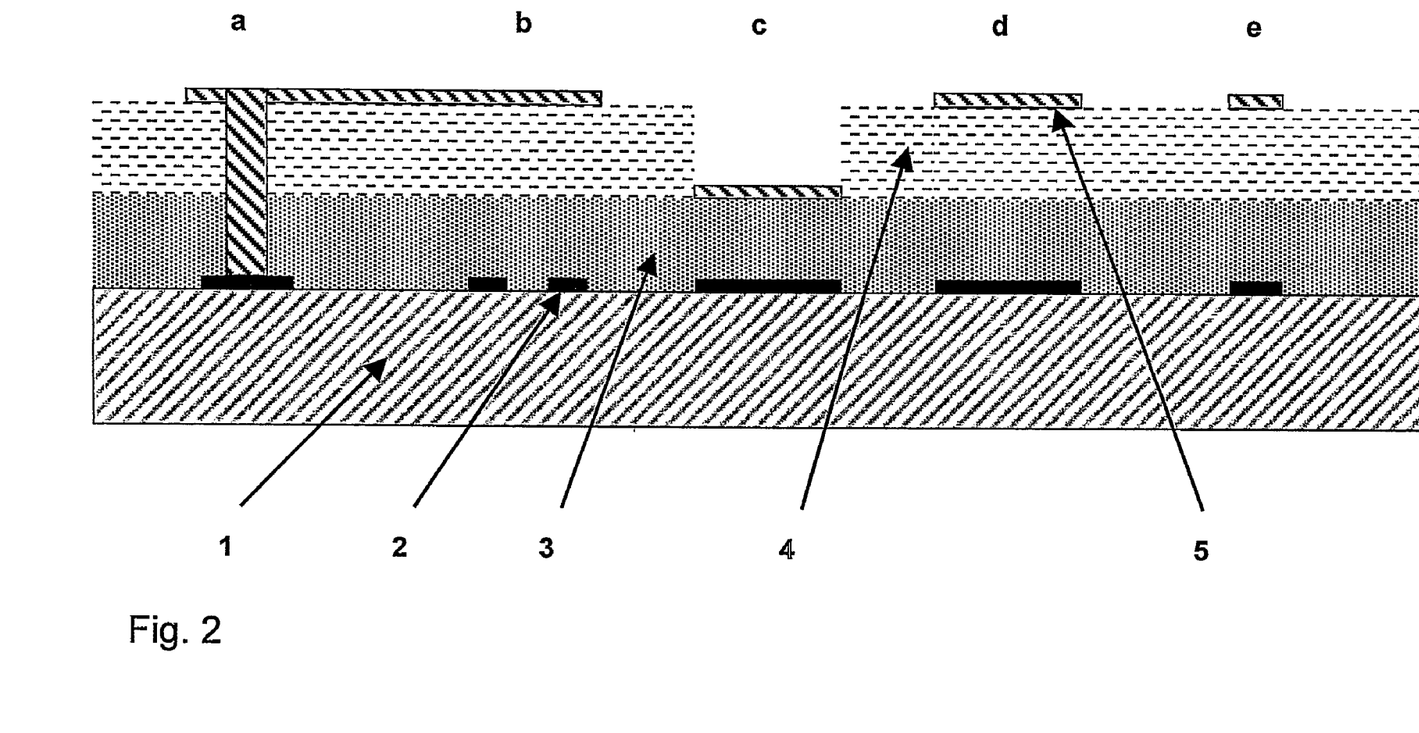
FIG. 2 once again shows all of the components which can also be seen in FIG. 1 but, in this case, the semiconductive layer at the location of the diode is not pulled as far as the level of the upper electrode of the other components but rather the upper electrode of the diode is deeper in this case.

All of the components and all of the layers which can also be seen in FIG. 1 are shown once again in FIG. 2 but in this case the semiconductive layer 3 at the location of the diode c is not pulled as far as the level of the upper electrode 5 of the other components of the electrical contact via a, transistor b, capacitor d and resistor e but rather the upper electrode 5 of the diode c is deeper in this case, at the level of the insulating layer 4.

Figure 3:
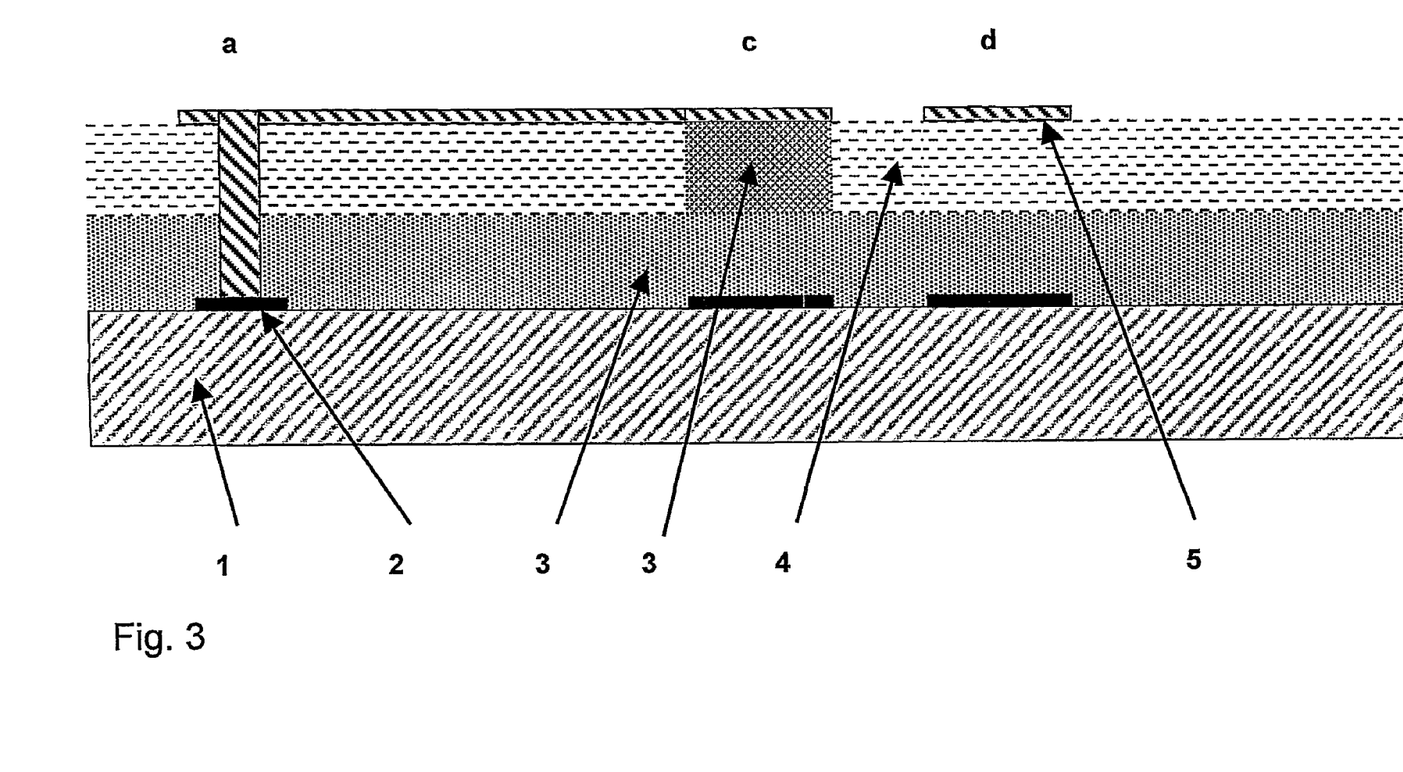
FIG. 3 shows a structure for supplying voltage; in this case, the components of a diode, a capacitor and a contact via are simultaneously produced on a substrate.

In FIG. 3, all of the essential components needed to supply voltage to a rectifier are implemented together on a substrate and, if all of the layers are common in all of the components, can be simultaneously produced. The layer sequence corresponds to that from FIG. 1, the same materials or other corresponding materials also being able to be used. The layer 1 is thus the substrate, the layer 2, patterned, is a conductive layer, 3 is the semiconductor layer, 4 is the insulating layer and 5 is the counterelectrode which is in turn patterned.

In this case, the following sequence of components is provided: on the far left on the outside is the contact via 1, the diode c is next to the latter and the capacitor d follows the diode c. An alternating voltage coming from an antenna can be rectified, for example, using the composite body shown here. The semiconductor is applied in a somewhat thicker form in the diode region c; this may be achieved, for example, via a using a decorative print during simultaneous production of the components.

Figure 4:
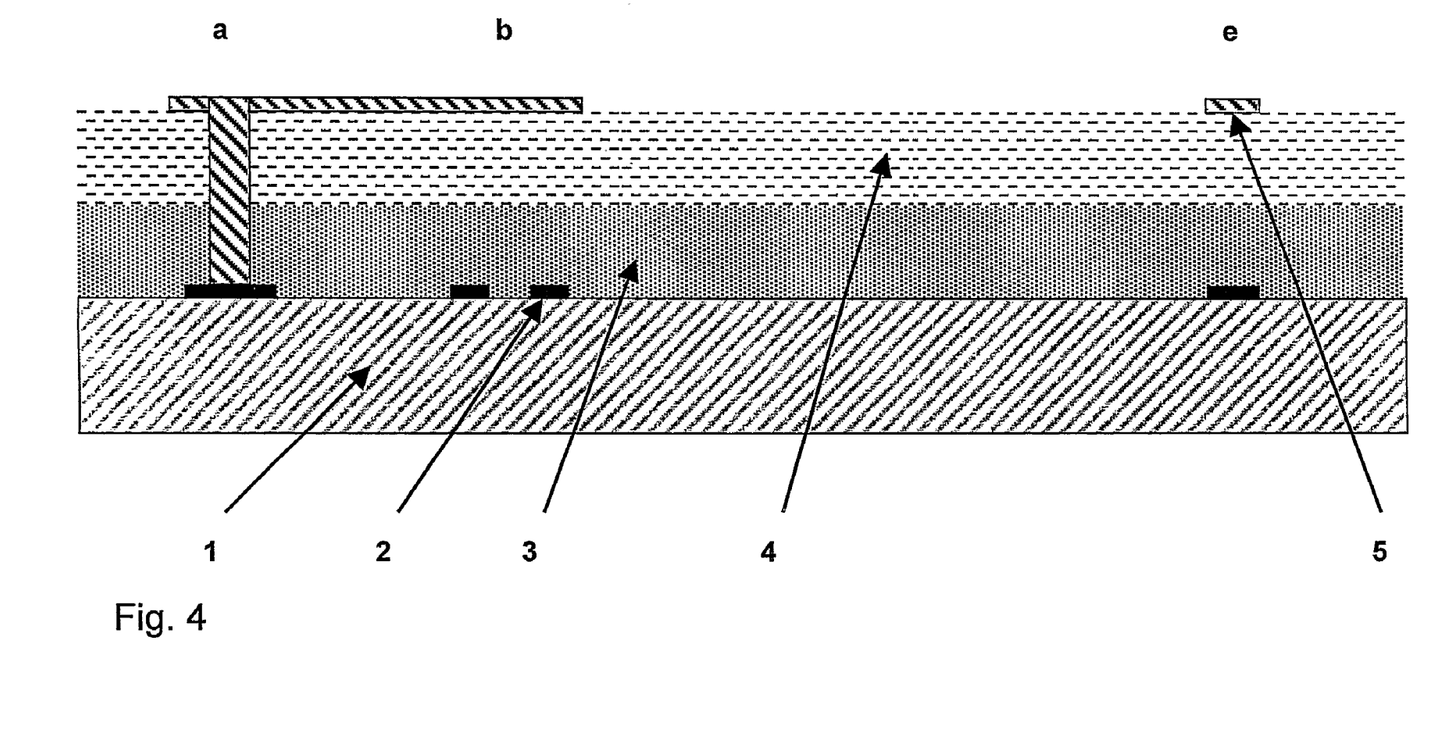
FIG. 4 finally shows a composite body which combines an electrical contact via, a transistor and a resistor and/or a coil.

FIG. 4 shows a multilayer composite body which combines an electrical contact via, a transistor and a resistor or a coil. At least PFETs (Polymer Field Effect Transistor), inverters, ring oscillators, flip-flops, frequency dividers and/or counters can be constructed using this layer structure and this arrangement of the components of the electrical contact via a, transistor b and resistor or coil e.

The layer structure again corresponds to that known from the other figures. Although a diode is not implemented in this case, the conductive material of the upper electrode 5 and of the lower electrode 2 may be entirely different, particularly in terms of its work function.

On account of the sensitivity of the device and/or of the materials, encapsulation and/or sealing of the components, which may comprise a wide variety of materials and/or laminates, is still recommended as the uppermost layer or termination. The encapsulation/sealing may be composed of a rigid or flexible material.

The essential parts of electronic devices, such as a transistor, field effect transistor, electrical contact via, resistor, interconnect resistor, inductance, diode, capacitor and rectifier are implemented, can be produced next to one another and/or behind one another on a substrate using this structure by means of layers which are continuously applied in a planar manner and/or patterned layers.

The cost-effective production, which is suitable for mass production, of preferably all components in the subassembly at the same time and in a continuous method makes it possible for individual components to contain layers which, in particular, have no function there; for example, in a field effect transistor and/or in a capacitor, the gate electrode may have a work function that differs from that of the source/drain electrode, the difference in the work function having no functionality in this case.

The capacitor and the interconnect resistors and likewise the contact via contain, for example, a semiconductor which is superfluous at that location and is not functional.

The essential parts of complex electronic devices, such as a field effect transistor, electrical contact via, resistor, interconnect resistor, coil, diode, capacitor and rectifier, can be produced next to one another and/or behind one another on a substrate using the structure shown in the figures by means of layers which are continuously applied in a planar manner and/or patterned layers.

The invention provides, for the first time, a possibility for a structure of an entire subassembly such as an RFID tag, the entire tag with all of the components being able to be implemented in one production process. As a result, a cost-effective production method which is suitable for mass production is described for the first time.

The invention claimed is:

1. A multilayer composite body comprising;
   a substrate;
   a plurality of spaced first electrically conductive electrodes on the substrate each comprising a layer of a given material having a first work function;
   a semiconductor layer on the substrate overlying and in contact with the plurality of electrodes;
   an insulation layer of a first given material on and overlying the semiconductor layer and over lying at least a portion of the plurality of first electrodes;
   a plurality of spaced second electrically conductive electrodes on at least the insulation layer and overlying the semiconductor layer, the second electrodes each comprising a layer of a second given material having a second work function different than the first work function;
   the first and second electrodes, the insulation layer and the semiconductor layer forming at least one organic transistor and at least one organic diode;
   the transistor and diode each comprising at least two electrically conductive electrode layers and at least one organic semiconductor layer in common with the transistor and diode between the at least two electrically conductive electrode layers.

2. The multilayer composite body as claimed in claim 1 wherein the first electrodes comprise a noble metal layer and the second electrodes comprise a base metal layer.

3. The multilayer composite body as claimed in 2, wherein the base electrodes are copper and the noble electrodes are silver.

4. The multilayer as claimed in claim 1 wherein the first and second electrodes form an electrode and a counterelectrode.

5. The multilayer composite body as claimed in claim 1 which contains a plurality of different components including the transistor and diode and contains at least one further layer which is in common to the different electronic organic components and, although being essential in one of the components, constitutes a superfluous layer in another of the components.

6. The multilayer composite body as claimed in claim 1 wherein the first and second electrodes, the insulation layer and the semiconductor layer further form a capacitor.

7. The multilayer composite body as claimed in claim 1 wherein the first and second electrodes, the insulation layer and the semiconductor layer further form at least two diodes and one capacitor.

8. The multilayer composite body as claimed in claim 1 wherein the first and second electrodes, the insulation layer and the semiconductor layer form at least three different components, including said diode, a capacitor and said transistor.

9. The multilayer composite body as claimed in claim 1 wherein the first and second electrodes, the insulation layer and the semiconductor layer form at least four different types of components.

10. The multilayer composite body as claimed in claim 1 wherein the first and second electrodes, the insulation layer and the semiconductor layer form at least one electronic component selected from the group consisting of an electrical contact via, a resistor, an interconnect resistor, a coil, a capacitor and a rectifier in combination with said diode and said transistor.

11. The multilayer composite body as claimed in claim 1 wherein at least one of the layers is on a substrate in a continuous planar structure.

12. The multilayer composite body as claimed in claim 1 wherein at least one of the layers is printed.

13. The multilayer composite body as claimed in claim 1 comprising a plurality of further components wherein one of the layers has no functionality in one component and comprises a continuous planar structure.

14. The multilayer composite body as claimed in claim 1 further comprising a first plurality of components wherein one of the first plurality of components is a capacitor, the semiconductor layer being in common to a second plurality of components including the capacitor in which capacitor the semiconductor layer is superfluous.

15. A multilayer composite body comprising:
   a plurality of components on a substrate;
   at least one component of the plurality of components comprising at least one layer; and
   a second component of the plurality on the substrate and comprising said at least one layer and which said at least one layer is superfluous in the second component.

16. A multilayer composite body comprising;
   at least two different electronic organic components;
   each component comprising at least two conductive electrode layers and at least one organic semiconductor layer in common with the at least two different components between the at least two electrode layers;
   the at least two electrode layers comprising two corresponding respective materials which have different work functions; and
   at least one further layer which is common to the different electronic organic components and, although being essential in one of the components, constitutes a superfluous layer in the other component.

17. A multilayer composite body comprising;
   at least four different types of electronic organic components;
   each component comprising at least two conductive electrode layers and at least one organic semiconductor layer in common with the at least four components and lying between the at feast two electrode layers;
   the at least two electrode layers comprising two corresponding respective materials which have different work functions.

18. A multilayer composite body comprising;
   at least two different electronic organic components;
   each component comprising at least two conductive electrode layers and at least one organic semiconductor layer in common with each component between the at least two electrode layers;
   the at least two electrode layers comprising two corresponding respective materials which have different work functions;
   wherein one of the layers has no functionality in one component and comprises a continuous planar structure.

* * * * *